United States Patent
Ichinose

(10) Patent No.: US 8,525,517 B2
(45) Date of Patent: Sep. 3, 2013

(54) MAGNETIC RESONANCE IMAGING APPARATUS

(75) Inventor: Nobuyasu Ichinose, Otawara (JP)

(73) Assignees: Kabushiki Kaisha Toshiba, Tokyo (JP); Toshiba Medical Systems Corporation, Otawara-shi, Tochigi (JP)

( * ) Notice: Subject to any disclaimer, the term of this patent is extended or adjusted under 35 U.S.C. 154(b) by 724 days.

(21) Appl. No.: 12/757,375

(22) Filed: Apr. 9, 2010

(65) Prior Publication Data

US 2010/0259262 A1    Oct. 14, 2010

(30) Foreign Application Priority Data

Apr. 10, 2009  (JP) .................................. 2009-096484
Mar. 16, 2010  (JP) .................................. 2010-059789

(51) Int. Cl.
*G01V 3/00*       (2006.01)

(52) U.S. Cl.
USPC ......................................... 324/312; 324/307

(58) Field of Classification Search
USPC ................................. 324/312, 307, 309, 314
See application file for complete search history.

(56) References Cited

U.S. PATENT DOCUMENTS

| | | | | |
|---|---|---|---|---|
| 5,558,091 A * | 9/1996 | Acker et al. | ................... | 600/424 |
| 5,936,406 A | 8/1999 | Potthast | | |
| 6,317,619 B1 * | 11/2001 | Boernert et al. | ............... | 600/410 |
| 6,794,872 B2 | 9/2004 | Meyer et al. | | |
| 7,259,559 B2 * | 8/2007 | Nabetani et al. | ............... | 324/309 |
| 7,622,920 B2 * | 11/2009 | Machida et al. | ............... | 324/307 |

FOREIGN PATENT DOCUMENTS

JP    10-179551    7/1998

* cited by examiner

*Primary Examiner* — Louis Arana
(74) *Attorney, Agent, or Firm* — Nixon & Vanderhye PC

(57) ABSTRACT

A storage unit stores coil positional information that indicates a physical position of an element coil relative to a representative position set on a receiving coil. A creating unit creates profile data that indicates a distribution of Nuclear Magnetic Resonance (NMR) signals in a coil-arrangement direction. A calculating unit calculates the position of a representative position set on the receiving coil by performing a regression analysis by using the coil positional information and the profile data. A control unit causes a display unit to display the position of each element coil based on the calculated position of the representative position.

20 Claims, 11 Drawing Sheets

| COIL NAME | GROUP | POSITIONAL FIXATION [mm] | COIL OUTER DIMENSIONS (x, y, z) [mm] | ELEMENT COIL NUMBER | RELATIVE POSITION (x, y, z) [mm] | ELEMENT SIZE (x, y, z) [mm] |
|---|---|---|---|---|---|---|
| ARRAY COIL A | α | 260 | (250, 300, 300) | 1 | (0, 0, -75) | (300, 300, 150) |
| ARRAY COIL A | α | 260 | (250, 300, 300) | 2 | (0, 0, +75) | (300, 300, 150) |
| ARRAY COIL B | α | NO | (500, 50, 500) | 1 | (0, 0, -180) | (500, 10, 120) |
| ARRAY COIL B | α | NO | (500, 50, 500) | 2 | (0, 0, -60) | (500, 10, 120) |
| ARRAY COIL B | α | NO | (500, 50, 500) | 3 | (0, 0, +60) | (500, 10, 120) |
| ARRAY COIL B | α | NO | (500, 50, 500) | 4 | (0, 0, +180) | (500, 10, 120) |
| ARRAY COIL C | β | NO | (500, 50, 500) | 1 | (0, 0, -185) | (500, 10, 100) |
| ARRAY COIL C | β | NO | (500, 50, 500) | 2 | (0, 0, -70) | (500, 10, 130) |
| ARRAY COIL C | β | NO | (500, 50, 500) | 3 | (0, 0, +60) | (500, 10, 130) |
| ARRAY COIL C | β | NO | (500, 50, 500) | 4 | (0, 0, +180) | (500, 10, 110) |

| COIL NAME | CONNECTION PORT | COIL POSITION (x, y, z) [mm] |
|---|---|---|
| ARRAY COIL A | PORT 1 | (0, 0, 260) |
| ARRAY COIL B | PORT 2 | (0, 0, 660) |
| ARRAY COIL C | PORT 3 | (0, 0, 300) |
| ARRAY COIL C | PORT 4 | (0, 0, 700) |

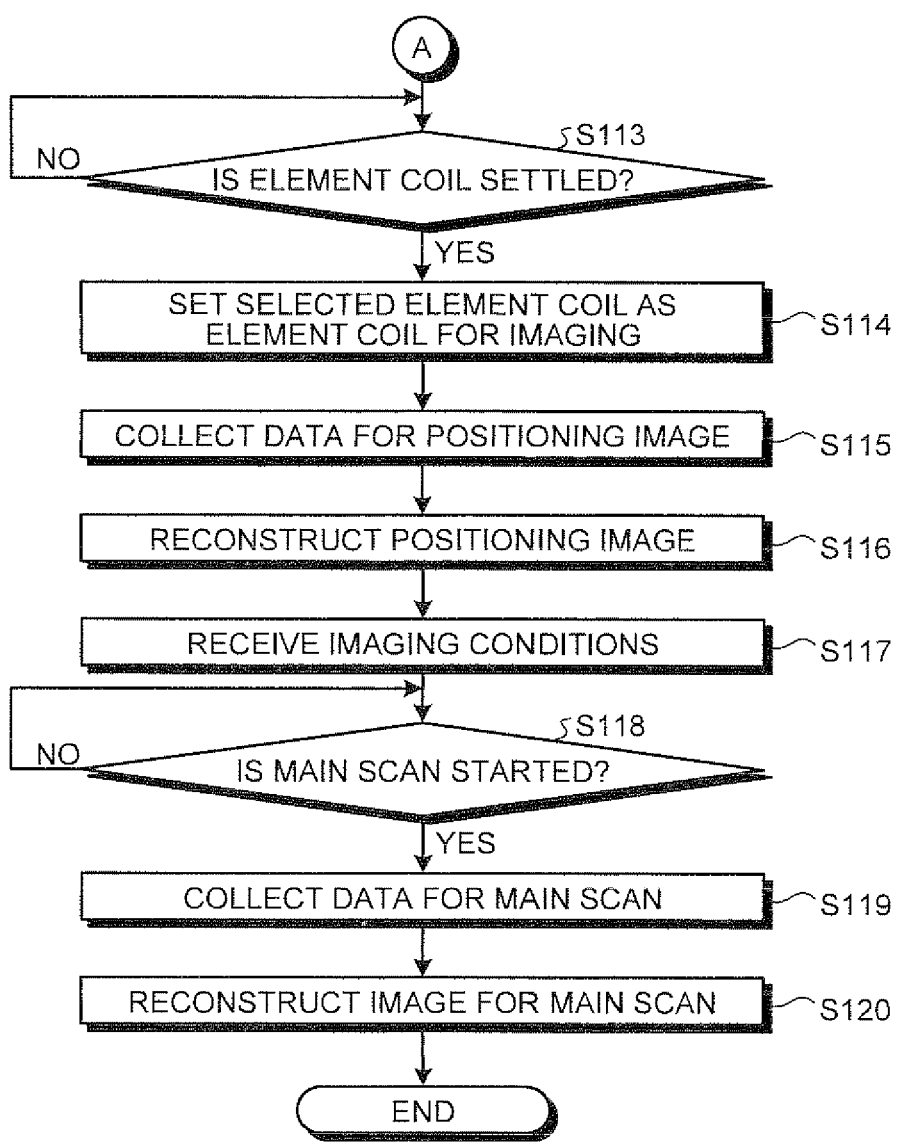

← GROUP β

← GROUP α

MAGNETIC RESONANCE IMAGING APPARATUS

CROSS-REFERENCE TO RELATED APPLICATIONS

This application is based upon and claims the benefit of priority from the prior Japanese Patent Application No. 2009-096484, filed on Apr. 10, 2009, No. 2010-059789, filed on Mar. 16, 2010; the entire contents of which are incorporated herein by reference.

BACKGROUND

1. Technical Field

The present invention relates to a magnetic resonance imaging apparatus that images an inside of a subject by using magnetic resonance phenomenon.

2. Related Art

Conventionally, a magnetic resonance imaging apparatus is an apparatus that reconstructs an image from a magnetic resonance signal generated along with excitation by magnetically exciting a nuclear spin of a subject placed in a static magnetic field with a radio-frequency signal at a Larmor frequency appropriate to the nucleus.

Such magnetic resonance imaging apparatus sometimes uses a receiving coil in which a plurality of element coils each configured to receive a magnetic resonance signal emitted from a subject is arranged, in some cases. Such receiving coil is also called an array coil.

A method known as a technology related to a receiving coil in which a plurality of element coils is arranged is a method of measuring the positions of element coils by placing a receiving coil onto a subject, for example, as shown in FIG. 15, then actually detecting a magnetic resonance signal, and using data created from the detected magnetic resonance signal (for example, see JP-A 10-179551 (KOKAI), or U.S. Pat. No. 6,794,872).

However, if the positions of individual coils are determined from a single measurement result, measurement errors are not sufficiently reduced. The reason for this is because, for example, when a coil is located at a position off the center of magnetic field, an error is produced due to degradation in uniformity of a magnetic field, degradation in linearity of a gradient magnetic field and/or signal variation from the body tissues.

BRIEF SUMMARY

According to one aspect of the present exemplary embodiments, a magnetic resonance imaging apparatus includes a receiving coil in which a plurality of element coils each configured to receive a magnetic resonance signal emitted from a subject is arranged; a storage unit that stores coil positional information with respect to each of the element coils that indicates a physical position of each of the element coils relative to a representative position set on the receiving coil; a creating unit that creates profile data with respect to each of the element coils based on magnetic resonance signals received by each of the element coils, the profile data indicating a distribution of the magnetic resonance signals in a coil arrangement direction indicating a direction in which the element coils are arranged; a calculating unit that calculates a position of the representative position set on the receiving coil in the coil arrangement direction by performing a regression analysis by using the coil positional information and the profile data; and a control unit that causes a display unit to display positions of the element coils based on the position of the representative position calculated by the calculating unit.

According to another aspect of the present exemplary embodiments, a magnetic resonance imaging apparatus includes a receiving coil in which a plurality of element coils each configured to receive a magnetic resonance signal emitted from a subject is arranged; a storage unit that stores coil positional information with respect to each of the element coils that indicates a physical position of each of the element coils relative to a representative position set on the receiving coil; a creating unit that creates profile data with respect to each of the element coils based on magnetic resonance signals received by each of the element coils, the profile data indicating a distribution of the magnetic resonance signals in a coil arrangement direction indicating a direction in which the element coils are arranged; a calculating unit that calculates a position of the representative position set on the receiving coil in the coil arrangement direction by performing a regression analysis by using the coil positional information and the profile data; and a setting unit that sets an element coil to be used for imaging from among the element coils based on the position of the representative position calculated by the calculating unit.

According to still another aspect of the present exemplary embodiments, a magnetic resonance imaging apparatus includes a plurality of receiving coils each of which includes a plurality of element coils that receives a magnetic resonance signal emitted from a subject; a creating unit that creates profile data with respect to each of the element coils based on magnetic resonance signals received by each of the element coils, the profile data indicating a distribution of the magnetic resonance signals in a coil arrangement direction indicating a direction in which the element coils are arranged; a calculating unit that calculates positions of representative positions set on the receiving coils in the coil arrangement direction based on the profile data; and a control unit that causes a display unit to display only a position of a receiving coil of which a position of a representative position is calculated among the receiving coils, based on the positions of the representative positions calculated by the calculating unit.

BRIEF DESCRIPTION OF THE DRAWINGS

FIGS. 9A and 9B are a flowchart of a flow of imaging by the MRI apparatus according to the embodiment;

DETAILED DESCRIPTION OF EXEMPLARY EMBODIMENTS

Exemplary embodiments of a magnetic resonance imaging apparatus according to the present invention will be explained below in detail with reference to the accompanying drawings. A Magnetic Resonance Imaging apparatus is referred to as an MRI apparatus, and a magnetic resonance signal is referred to as a Nuclear Magnetic Resonance (NMR) signal in the embodiments described below. The present invention is not limited by the embodiments described below.

Figure 1:
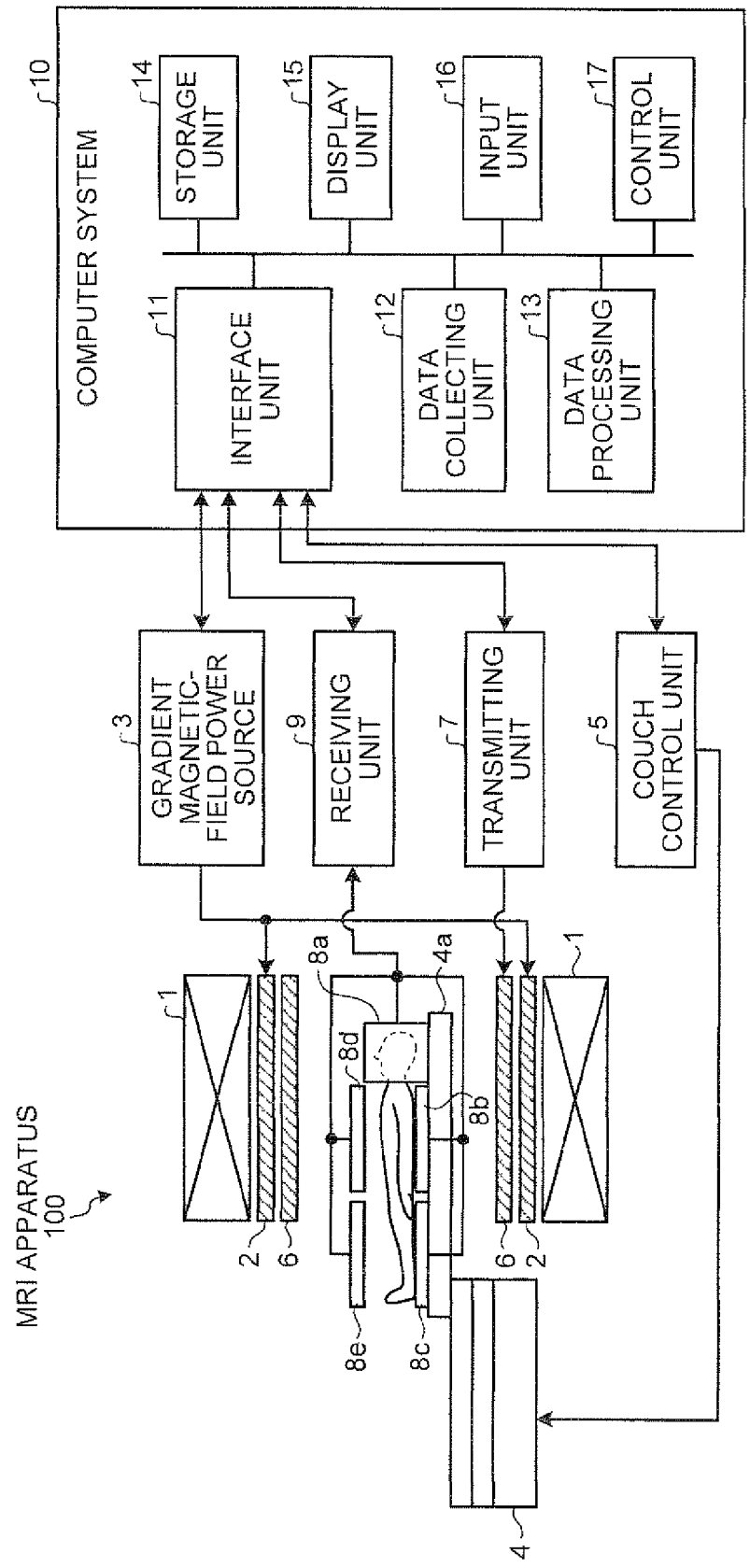
FIG. 1 is a schematic diagram of a configuration of a Magnetic Resonance Imaging (MRI) apparatus according to an embodiment of the present invention.

First of all, a configuration of an MRI apparatus according to an embodiment of the present invention is explained below. FIG. 1 is a schematic diagram of a configuration of the MRI apparatus according to the embodiment. As shown in the figure, an MRI apparatus 100 according to the embodiment includes a static magnetic-field magnet 1, a gradient coil 2, a gradient magnetic-field power source 3, a couch 4, a couch control unit 5, a transmitting coil 6, a transmitting unit 7, receiving coils 8a to 8e, a receiving unit 9, and a computer system 10.

The static magnetic-field magnet 1 is formed in a hollow drum shape, and generates a uniform static magnetic field in its inside space. For example, a permanent magnet, or a super conducting magnet is used as the static magnetic-field magnet 1.

The gradient coil 2 is formed in a hollow drum shape, and is arranged on the inner side of the static magnetic-field magnet 1. The gradient coil 2 is formed of three coils in combination corresponding to x, y, and z axes orthogonal to one another, and the three coils generate gradient magnetic fields of which field strengths vary along three directions of the x, y, and z axes, respectively, by individually receiving a current supply from the gradient magnetic-field power source 3, which will be described later. It is assumed that the z axis direction is the same direction as that of the static magnetic field.

The gradient magnetic fields of the x, y, and z axes generated by the gradient coil 2 correspond to, for example, a readout gradient magnetic field Gr, a phase-encoding gradient magnetic field Ge, and a slice-selective gradient magnetic field Gs, respectively. The readout gradient magnetic field Gr is used for changing the frequency of an NMR signal in accordance with a spatial position. The phase-encoding gradient magnetic field Ge is used for changing the phase of an NMR signal in accordance with a spatial position. The slice-selective gradient magnetic field Gs is used for arbitrarily setting a scan cross section.

The gradient magnetic-field power source 3 supplies a current to the gradient coil 2 based on pulse-sequence execution data sent from the computer system 10.

The couch 4 includes a couchtop 4a on which a subject P is to be placed, and under the control of the couch control unit 5, which will be described later, the couch 4 inserts the couchtop 4a on which the subject P is placed, into a bore (a scanning space) of the gradient coil 2. Usually, the couch 4 is placed such that the longitudinal direction of the couch 4 is to be parallel to the central axis of the static magnetic-field magnet 1.

The couch control unit 5 moves the couchtop 4a in the longitudinal direction and upward and downward by driving the couch 4.

The transmitting coil 6 is arranged on the inner side of the gradient coil 2, and generates a radio-frequency magnetic field by receiving supply of a radio-frequency pulse from the transmitting unit 7.

The transmitting unit 7 transmits a radio-frequency pulse corresponding to a Larmor frequency to the transmitting coil 6 based on pulse-sequence execution data sent from the computer system 10.

The receiving coils 8a to 8e are arranged on the inner side of the gradient coil 2, and receive an NMR signal emitted from the subject P owing to an influence of a radio-frequency magnetic field. Each of the receiving coils 8a to 8e is an array coil that includes a plurality of element coils each of which receives a magnetic resonance signal emitted from the subject P; and when each of the element coils receives an NMR signal, the receiving coils 8a to 8e output the received NMR signal to the receiving unit 9.

The receiving coil 8a is a coil for head to be placed on the head of the subject P. Each of the receiving coils 8b and 8c is a coil for spine to be arranged between the back of the subject P and the couchtop 4a. Each of the receiving coils 8d and 8e is a coil for abdomen to be placed on the abdomen of the subject.

The receiving unit 9 creates NMR-signal data based on NMR signals output by the receiving coils 8a to 8e based on pulse-sequence execution data sent from the computer system 10. Moreover, after creating NMR-signal data, the receiving unit 9 transmits the NMR-signal data to the computer system 10.

The receiving unit 9 includes a plurality of receiving channels for receiving NMR signals output from the element coils included in the receiving coils 8a to 8e. When the computer system 10 notifies the receiving unit 9 of an element coil to be used for imaging, the receiving unit 9 allocates a receiving channel to the notified element coil so as to receive NMR signals output from the notified element coil.

The computer system 10 performs overall control of the MRI apparatus 100, data collection, image reconstruction, and the like. The computer system 10 includes an interface unit 11, a data collecting unit 12, a data processing unit 13, a storage unit 14, a display unit 15, an input unit 16, and a control unit 17.

The interface unit 11 is connected to the gradient magnetic-field power source 3, the couch control unit 5, the transmitting unit 7, and the receiving unit 9; and controls input and output of signals that are given and received between each of the connected units and the computer system 10.

The data collecting unit 12 collects NMR-signal data transmitted from the receiving unit 9 via the interface unit 11.

When NMR-signal data is collected, the data collecting unit 12 stores the collected NMR-signal data into the storage unit 14.

The data processing unit 13 performs post-processing, i.e., reconstruction processing, such as a Fourier transform, on the NMR-signal data stored in the storage unit 14, and creates spectrum data or image data of a desired nuclear spin inside the subject P. Moreover, when performing imaging for a positioning image, the data processing unit 13 creates profile data with respect to each of the element coils that indicates a distribution of NMR signals in the arrangement direction of the element coils, based on the NMR signals received by each of the element coils included in the receiving coils 8a to 8e. The data processing unit 13 stores various created data into the storage unit 14.

The storage unit 14 stores NMR-signal data collected by the data collecting unit 12, and image data created by the data processing unit 13, with respect to each subject P. The storage unit 14 will be explained in detail later.

The display unit 15 displays various information, such as spectrum data or image data created by the data processing unit 13. A display device, such as a liquid crystal display, can be used as the display unit 15.

The input unit 16 receives various operations and information input from an operator. As the input unit 16, a pointing device, such as a mouse or a trackball, a selecting device, such as a mode switch, and an input device, such as a keyboard, can be used as required.

The control unit 17 includes a Central Processing Unit (CPU) and a memory, both of which are not shown, and controls the MRI apparatus 100 overall by controlling each of the functional units described above. The control unit 17 is explained below in detail.

Figures 2, 3:
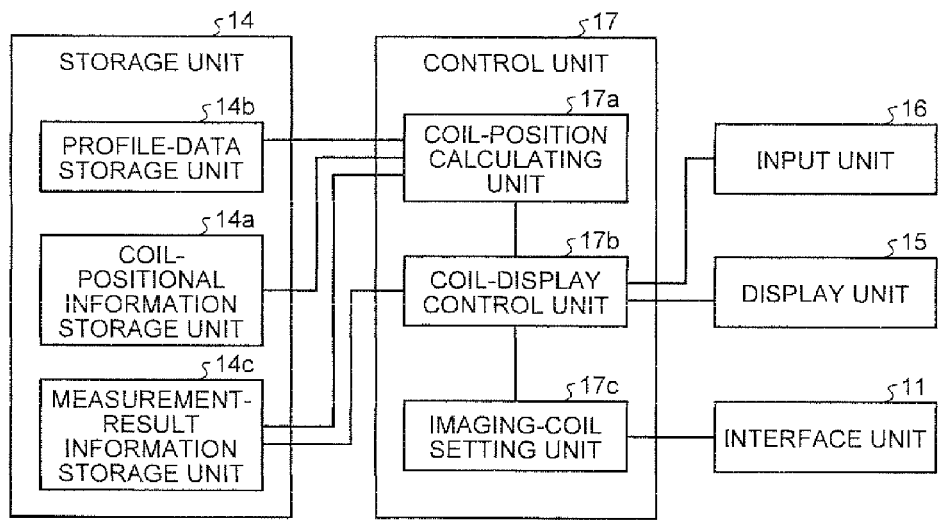
FIG. 2 is a functional block diagram of a detailed configuration of a storage unit and a control unit according to the embodiment.
FIG. 3 is a schematic diagram that depicts an example of coil positional information stored by a coil-positional information storage unit according to the embodiment.

Detailed configurations of the storage unit 14 and the control unit 17 are explained below. FIG. 2 is a functional block diagram of a detailed configuration of the storage unit 14 and the control unit 17.

As shown in FIG. 2, the storage unit 14 includes a coil-positional information storage unit 14a, a profile-data storage unit 14b, and a measurement-result information storage unit 14c.

The coil-positional information storage unit 14a stores coil positional information that indicates physical positions of a plurality of element coils relative to respective representative positions set on the receiving coils 8a to 8e. FIG. 3 is a schematic diagram that depicts an example of coil positional information stored by the coil-positional information storage unit 14a. As shown in FIG. 3, specifically, the coil-positional information storage unit 14a stores information that a "coil name" is associated with "group", "positional fixation", "coil outer dimensions", "element coil number", "relative position", and "element size", as coil positional information.

The coil name is identification information for uniquely identifying a type of the receiving coils 8a to 8e. For example, according to the example of FIG. 3, an "array coil A" denotes the receiving coil 8a that is a coil for head, an "array coil B" denotes the receiving coil 8b or 8c that is a coil for spine, and an "array coil C" denotes the receiving coil 8d or 8e that is a coil for abdomen.

The group is identification information for identifying a group into which adjacently arranged receiving coils are grouped. For example, the example of FIG. 3 indicates that the array coils A and the array coils B belong to a "group α", and the array coils C belongs to a "group β".

The positional fixation is information that indicates whether the positions at which the receiving coils 8a to 8e are arranged are fixed. For example, the example of FIG. 3 indicates that the position of the array coil A is fixed at a position of "260 millimeters", and the positions of the array coils B and the array coils C are movable.

The coil outer dimensions are information that indicates outer dimensions of the receiving coils 8a to 8e. Specifically, the coil outer dimensions are expressed by respective outer dimensions in the x, y, and z axis directions. For example, the example of FIG. 3 indicates that the outer dimension of the array coil A in the x axis direction is 250 millimeters, the outer dimension in the y axis direction is 300 millimeters, and the outer dimension in the z axis direction is 300 millimeters.

The element coil number is a number for uniquely identifying an element coil included in the receiving coils 8a to 8e with respect to each of the receiving coils. For example, the example of FIG. 3 indicates that the array coil A includes two element coils "1" and "2"; the array coil B includes four element coils "1" to "4"; and the array coil C includes four element coils "1" to "4".

The relative position is information that indicates a physical position of each of the element coils relative to a representative position set on each of the receiving coils 8a to 8e. Specifically, the relative position is expressed by relative coordinates (x, y, z) in the x, y, and z axis directions where an origin point is a representative position set at an arbitrary position of each receiving coil. For example, the example of FIG. 3 indicates that the relative position of an element coil of the element coil number: "1" included in the array coil A is (0, 0, −75); and the relative position of an element coil of the element coil number: "2" similarly included in the array coil A is (0, 0, 75). In other words, the array coil A includes the element coil of the element coil number: "1" at a position at a distance of −75 millimeters in the z axis direction from the representative position as the origin point, and the element coil of the element coil number: "2" at a position at a distance of 75 millimeters in the z axis direction.

The element size is information that indicates a size of an element coil included in the receiving coils 8a to 8e. The element size corresponds to the length of the element coil in the z axis directions shown in FIGS. 6 and 8A to 8C. The element size correlates to a sensitivity area of the coil element.

Figures 4, 5:
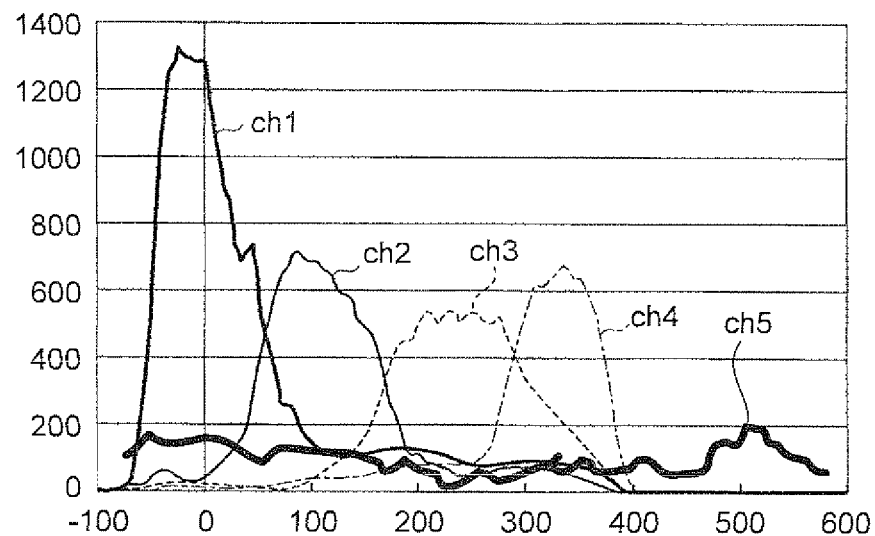
FIG. 4 is a schematic diagram that depicts an example of profile data stored by a profile-data storage unit according to the embodiment.
FIG. 5 is a schematic diagram that depicts an example of measurement result information stored by a measurement-result information storage unit according to the embodiment.

Returning to explanation of FIG. 2, the profile-data storage unit 14b stores profile data created by the data processing unit 13 with respect to each element coil. FIG. 4 is a schematic diagram that depicts an example of profile data stored by the profile-data storage unit 14b. In FIG. 4, the horizontal axis represents an actual position of an NMR signal in the arrangement direction of the element coils where an origin point "0" is the position of the center of magnetic field; and the vertical axis represents the strength of an NMR signal. Moreover, in FIG. 4, "ch1" to "ch5" denote respective profile data of five element coils. As shown in FIG. 4, specifically, the profile-data storage unit 14b stores a distribution of NMR signals in the arrangement direction of the element coils as profile data with respect to each element coil.

The measurement-result information storage unit 14c stores results of calculations of respective representative positions of the receiving coils 8a to 8e as measurement result information. A representative position to be stored as measurement result information is calculated by a coil-position calculating unit 17a, which will be described later. FIG. 5 is a schematic diagram that depicts an example of measurement result information stored by the measurement-result information storage unit 14c. As shown in FIG. 5, specifically, the measurement-result information storage unit 14c stores information that "coil name" is associated with "connection port" and "coil position", as measurement result information.

The coil name is identification information for uniquely identifying a type of the receiving coils 8a to 8e, as described above.

The connection port is information that indicates a port connected to an element coil. For example, the example of FIG. 5 indicates that the array coil A is connected to a port identified with "port 1"; and the array coil B is connected to a port identified with "port 2". Moreover, the example of FIG. 5 indicates that two of the array coils C are used, one of them connected to a port identified with "port 3", and the other is connected to a port identified with "port 4".

The coil position is information, that indicates a representative position set on each of the receiving coils 8a to 8e. Specifically, the coil position is expressed by the relative coordinates (x, y, z) in the x, y, and z axis directions where an origin point is a tip end of the couchtop 4a (an end on the head side of the subject P shown in FIG. 1). For example, the example of FIG. 5 indicates that a representative position of the array coil A stands at a position at a distance of 260 millimeters Ln the z axis direction from the tip end of the couchtop 4a as the origin point. Moreover, the example of FIG. 5 indicates that two of the array coils C are used, a representative position of one of the array coils C is at a position at a distance of 300 millimeters in the z axis direction from the tip end of the couchtop 4a as the origin point, and a representative position of the other is at a position at a distance of 700 millimeters in the z axis direction.

Returning to explanation of FIG. 2, the control unit 17 particularly includes the coil-position calculating unit 17a, a coil-display control unit 17b, and an imaging-coil setting unit 17c.

The coil-position calculating unit 17a calculates respective representative positions of the receiving coils 8a to 8e by performing a regression analysis by using coil positional information stored by the coil-positional information storage unit 14a, and profile data stored by the profile-data storage unit 14b.

Figure 6:
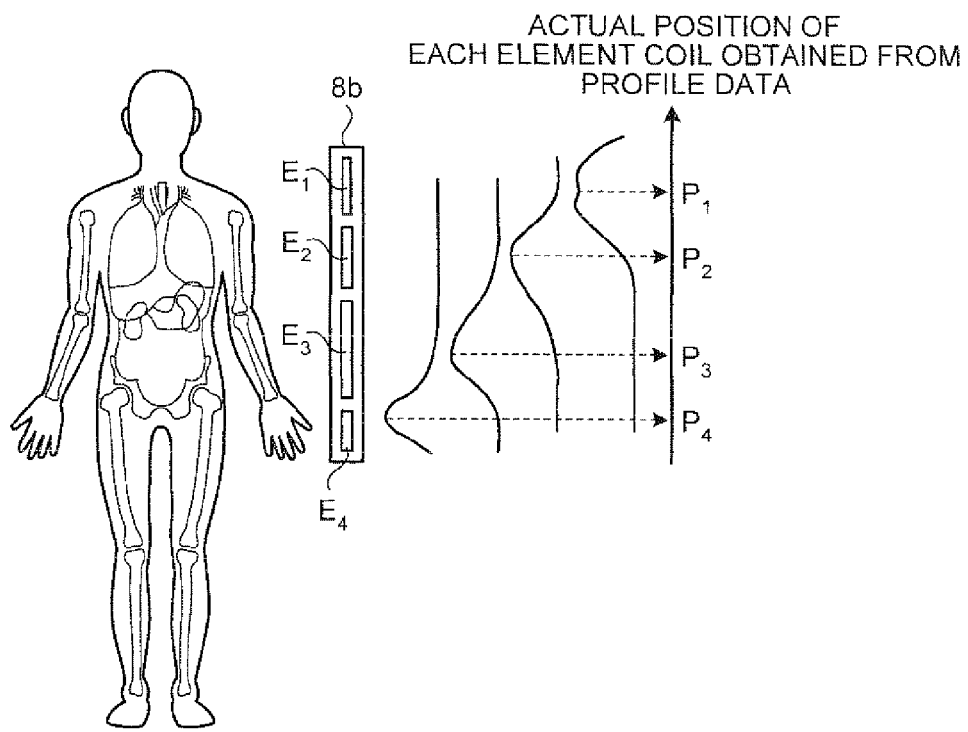
FIGS. 6 and 7 are schematic diagrams for explaining an example of calculation of a representative position of a receiving coil performed by a coil-position calculating unit according to the embodiment.
Figure 7:
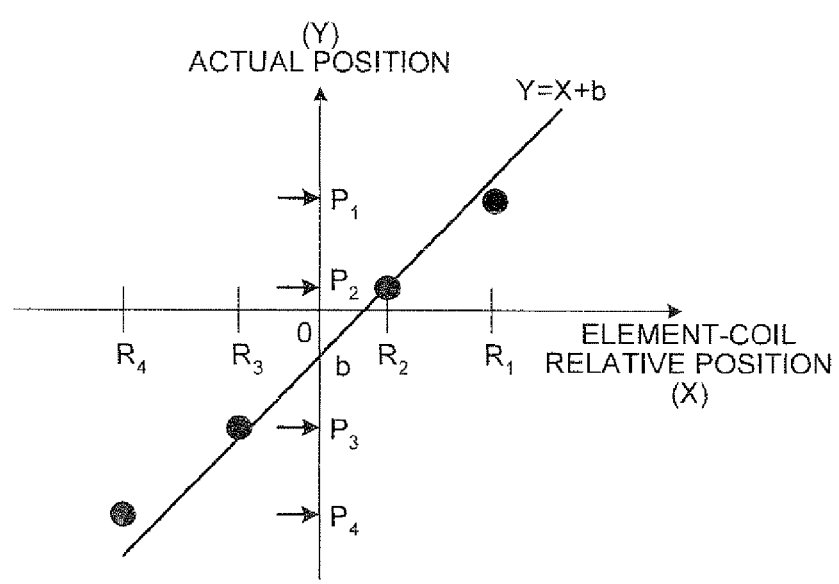

For example, the coil-position calculating unit 17a calculates a representative position of each of the receiving coils 8a to 8e by performing a regression analysis by using the method of least squares. FIGS. 6 and 7 are schematic diagrams for explaining an example of calculation of a representative position of a receiving coil performed by the coil-position calculating unit 17a.

As shown in FIG. 6, for example, it is assumed that the receiving coil 8b includes element coils $E_1$ to $E_4$. It is assumed that $P_1$ to $P_4$ denote positions of respective peaks of respective NMR signals received by the element coils $E_1$ to $E_4$, respectively, according to profile data stored by the profile-data storage unit 14b. Moreover, it is assumed that relative positions of the element coils $E_1$ to $E_4$ relative to the representative position of the receiving coil 8b are denoted by $R_1$ to $R_4$, respectively, according to coil positional information stored by the coil-positional information storage unit 14a.

In such case, the coil-position calculating unit 17a uses a function $Y=X+b$, where an explanatory variable X denotes the relative position of an element coil relative to the receiving coil 8b, and an objective variable Y denotes a position of a peak of NMR signals received by each element coil. The coil-position calculating unit 17a then calculates an intercept b by using the method of least squares by using the positions $P_1$ to $P_4$ of peaks of NMR signals, and relative positions $R_1$ to $R_4$ of the element coils $E_1$ to $F_4$, as sample data, as shown in FIG. 7.

Although the embodiment is explained in a case where the coil-position calculating unit 17a uses a position of a peak of NMR signals, the coil-position calculating unit 17a can also use the center of gravity obtained from a distribution of signal values of NMR signals, or can obtain a peak after performing curve-fitting on NMR signals.

Assuming that the arrangement direction of the element coils $E_1$ to $E_4$ is "coil arrangement direction", the horizontal axis in FIG. 7 represents the position in the coil arrangement direction where the origin point "0" is the representative position of the receiving coil 8b. Moreover, in FIG. 7, the vertical axis represents the actual position of an NMR signal in the coil arrangement direction where the origin point "0" is the position of the center of magnetic field, and corresponds to the horizontal axis shown in FIG. 4. Therefore, the intercept b that is calculated here denotes a position at which a representative position of the receiving coil 8b stands in the coil arrangement direction, where the origin point "0" is the position of the center of magnetic field. In other words, the coil-position calculating unit 17a calculates an actual position in the coil arrangement direction of the representative position set on the receiving coil 8b, relative to the center of magnetic field.

The coil-position calculating unit 17a calculates a representative position on each of the receiving coils 8a to 8e according to the method described above. The coil-position calculating unit 17a then converts the calculated representative position with respect to each of the receiving coils 8a to 8e, into relative coordinates in the x, y, and z axis directions where an origin point is the tip end of the couchtop 4a. The coil-position calculating unit 17a then creates information that the representative position converted into the relative coordinates having an origin point at the tip end of the couchtop 4a is associated with the coil name of a receiving coil and information indicating a port connected to the receiving coil, and stores the created information into the measurement-result information storage unit 14c as measurement result information (see FIG. 5).

In this way, the coil-position calculating unit 17a stores a representative position of each receiving coil by substituting it into relative coordinates relative to the couchtop 4a, for example, even when the couchtop 4a is moved, thereby easily obtaining a position at which each element coil is positioned relative to the center of magnetic field.

Although the coil-position calculating unit 17a is explained above in a case of calculating a representative position by using the method of least squares, the present invention is not limited to this, and it can be configured to use another statistical method that is generally used for a regression analysis.

For example, a case of performing a regression analysis by using a linear function $Y=X+b$ is explained above; however, a regression analysis can be performed by using another function, such as a quadric function or an exponential function. In such case, for example, the coil-position calculating unit 17a estimates the value of a coefficient included in a certain function by using a position of a peak of NMR signals received by each element coil (or a position of the center of gravity in a distribution of signal values of NMR signals), and a relative position of each element coil relative to the representative position of the receiving coil, as sample data. Accordingly, an approximate expression $Y=f(X)$ can be obtained, which represents relation between a relative position X of an element coil relative to the representative position of the receiving coil, and a position Y of a peak of NMR signals received by each element coil (or a position of the center of gravity in a distribution of signal values of NMR signals). The coil-position calculating unit 17a then calculates an actual position of the representative position set on the receiving coil 8b by obtaining Y by using the obtained approximate expression Y=f(X), where X=0.

The coil-display control unit 17b causes the display unit 15 to display the positions of a plurality of element coils based on a representative position calculated by the coil-position calculating unit 17a. Specifically, when the coil-position calculating unit 17a calculates the representative position of each receiving coil, the coil-display control unit 17b causes the display unit 15 to display element coils of the each receiving coil by referring to measurement result information stored by the measurement-result information storage unit 14c.

Figure 8A:
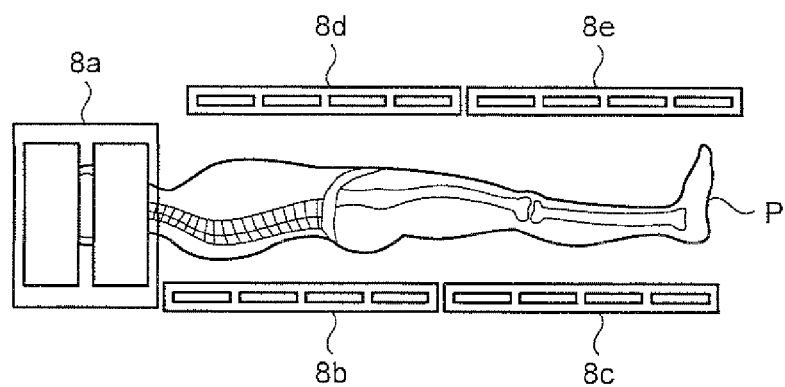
FIGS. 8A, 8B, and 8C are schematic diagrams that depict an example of display of element coils by a coil-display control unit according to the embodiment.
Figure 8B:
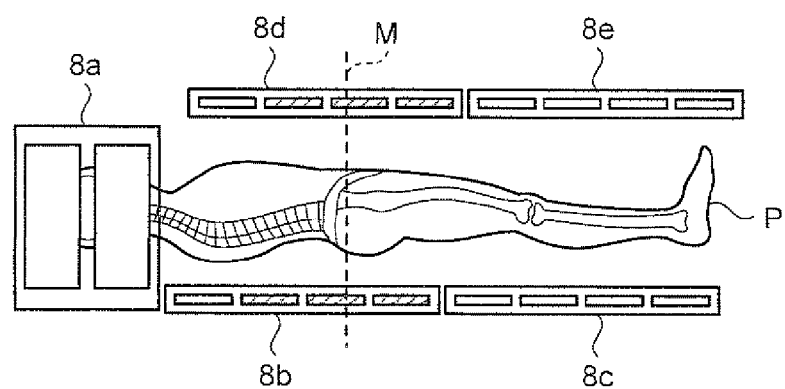
Figure 8C:
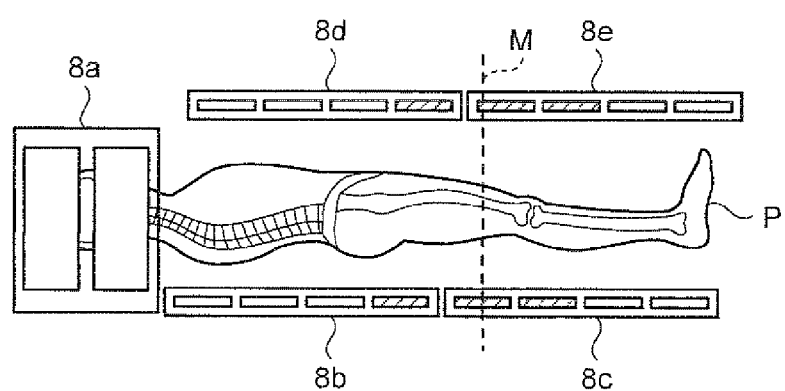

FIGS. 8A to 8C are schematic diagrams that depict an example of display of element coils by the coil-display control unit 17b. As shown in FIG. 8A, for example, the coil-display control unit 17b causes the display unit 15 to display respective Graphical User Interfaces (GUIs) that represent the subject P, the receiving coils 8a to 8e, and element coils of each of the receiving coils.

Moreover, as shown in FIG. 8B, the coil-display control unit 17b causes display by superimposing a line M representing the center of magnetic field on the GUIs of the element coils. A way of representing the center of magnetic field is not necessarily limited to a line, and the center of magnetic field can be displayed by another way, as long as the display method clearly indicates positional relation between the center of magnetic field and the element coil.

Moreover, the coil-display control unit 17b directs that that an element coil overlapping the center of magnetic field and an element coil adjacent to the element coil are displayed in a color different from the color of the other element coils. If no element coil overlaps with the center of magnetic field, an element coil closest to the center of magnetic field can be displayed in a further different color. In such case, the coil-display control unit 17b receives an effective range of element coils from the operator in advance. The coil-display control unit 17b then determines an effective range with reference to the center of magnetic field when displaying the line M of the center of magnetic field, and controls the color of an element coil included in the determined effective range to be changed.

Moreover, when the couchtop 4a is moved, the coil-display control unit 17b acquires the amount of movement of the couchtop 4a. The coil-display control unit 17b then moves the line M representing the center of magnetic field based on the amount of movement of the acquired couchtop 4a, as shown in FIG. 8O.

In this way, as well as directing display of the element coils, the coil-display control unit 17b receives an operation of selecting an element coil to be used for imaging from among the displayed element coils, from the operator via the input unit 16. After receiving the operation of selecting the element coil, when further receiving from the operator an operation of settling the selected element coil as a coil for imaging, the coil-display control unit 17b then notifies the imaging-coil setting unit 17c of the element coil that is selected at that moment.

The imaging-coil setting unit 17c sets an element coil to be used for imaging from among the element coils based on the representative positions of the receiving coils calculated by the coil-position calculating unit 17a. Specifically, when the imaging-coil setting unit 17c is notified by the coil-display control unit 17b of an element coil selected by the operator, the imaging-coil setting unit 17c sets the notified element coil as an element coil to be used for imaging by notifying the receiving unit 9 of the notified element coil.

Although explained above is a case where upon being notified of an element coil from the coil-display control unit 17b, the imaging-coil setting unit 17c sets the notified element coil as a coil to be used for imaging; the present invention is not limited to this. For example, it can be configured such that when the coil-position calculating unit 17a calculates respective representative positions of the receiving coils, the imaging-coil setting unit 17c specifies an element overlapping the center of magnetic field based on the calculated representative positions, and sets the element coil as an element coil for imaging.

Figure 9A:
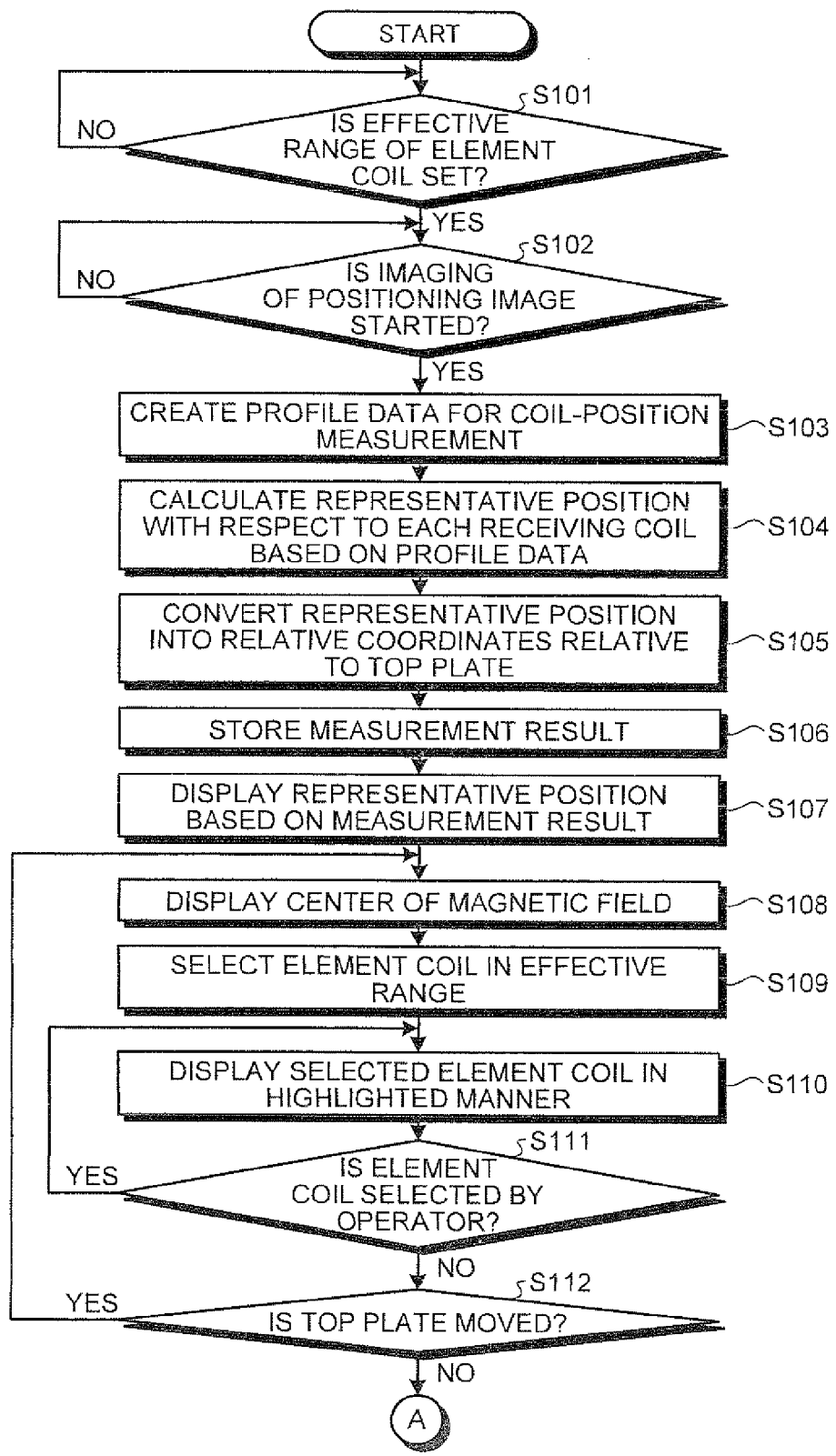

A flow of imaging by the MRI apparatus 100 according to the embodiment is explained below. FIGS. 9A and 9B are a flowchart of a flow of imaging by the MRI apparatus 100 according to the embodiment.

As shown in FIGS. 9A and 9B, according to the embodiment, after an effective range of element coil is set by the operator via the input unit 16 (Yes at Step S101); when it is instructed to start imaging of a positioning image (Yes at Step S102); the control unit 17 collects data by controlling the gradient magnetic-field power source 3 and the transmitting unit 7 based on imaging conditions for coil-position measurement; and the data processing unit 13 creates profile data for coil-positioning (Step S103).

Subsequently, the coil-position calculating unit 17a calculates a representative position with respect to each receiving coil based on the profile data created by the data processing unit 13 (Step S104). Furthermore, the coil-position calculating unit 17a converts the calculated representative position into the relative coordinates relative to the couchtop 4a (Step S105), and stores measurement result information including the representative position converted into the relative coordinates into the measurement-result information storage unit 14c (Step S106).

After that, the coil-display control unit 17b refers to the measurement result information stored by the measurement-result information storage unit 14c, and causes the display unit 15 to display the respective representative positions of the receiving coils (Step S107), and further causes the display unit 15 to display the center of magnetic field (Step S108). Subsequently, the coil-display control unit 17b selects an element coil in the effective range set by the operator (Step S109), and displays the selected element coil in a highlighted manner (Step S110).

After that, if the operator newly selects an element coil (Yes at Step S111), the coil-display control unit 17b displays the element coil selected by the operator in a highlighted manner (Step S110). By contrast, if element coil is not newly selected by the operator (No at Step S111), the coil-display control unit 17b confirms whether the couchtop 4a is moved. If the couchtop 4a is moved (Yes at Step S112), the coil-display control unit 17b redisplays the center of magnetic field based on the amount of movement of the couchtop 4a, and along with this, displays the element coil in the effective range in a highlighted manner.

By contrast, if the couchtop is not moved (No at Step S112), and if the operator gives an instruction to settle an element coil (Yes at Step S113); the imaging-coil setting unit 17c sets the selected element coil at that moment as an element coil for imaging (Step S114).

After that, the control unit 17 collects data for a positioning image by controlling the gradient magnetic-field power source 3 and the transmitting unit 7 (Step S115), and the data processing unit 13 reconstructs a positioning image from the collected data (Step S116).

After imaging conditions including setting of a Field Of View (FOV) on the positioning image are then received from the operator (Step S117); when an instruction to start a main scan is given (Yes at Step S118), the control unit 17 collects data for the main scan by controlling the gradient magnetic-field power source 3 and the transmitting unit 7 based on the set imaging conditions (Step S119), and the data processing unit 13 reconstructs an image for the main scan from the collected data (Step S120).

As described above, according to the embodiment, the coil-positional information storage unit 14a stores coil positional information that indicates physical positions of a plurality of element coils relative to representative positions set on the receiving coils 8a to 8e. The data processing unit 13 creates profile data with respect to each element coil that indicates a distribution of NMR signals in the arrangement direction of the element coils based on the NMR signals received by each of the element coils. The coil-position calculating unit 17a then calculates a position of the representative positions of the receiving coil by performing a regression analysis by using the coil positional information stored by the coil-positional information storage unit 14a and the profile data created by the data processing unit 13. The coil-display control unit 17b causes the display unit 15 to display the positions of the element coils based on the position of the representative positions calculated by the coil-position calculating unit 17a. The imaging-coil setting unit 17c sets an element coil to be used for imaging from among the element coils based on the representative positions of the receiving coils calculated by the coil-position calculating unit 17a. Therefore, according to the embodiment, after the positions of the element coils included in the receiving coils are accurately measured, an element coil for imaging can be easily set.

Figure 10:
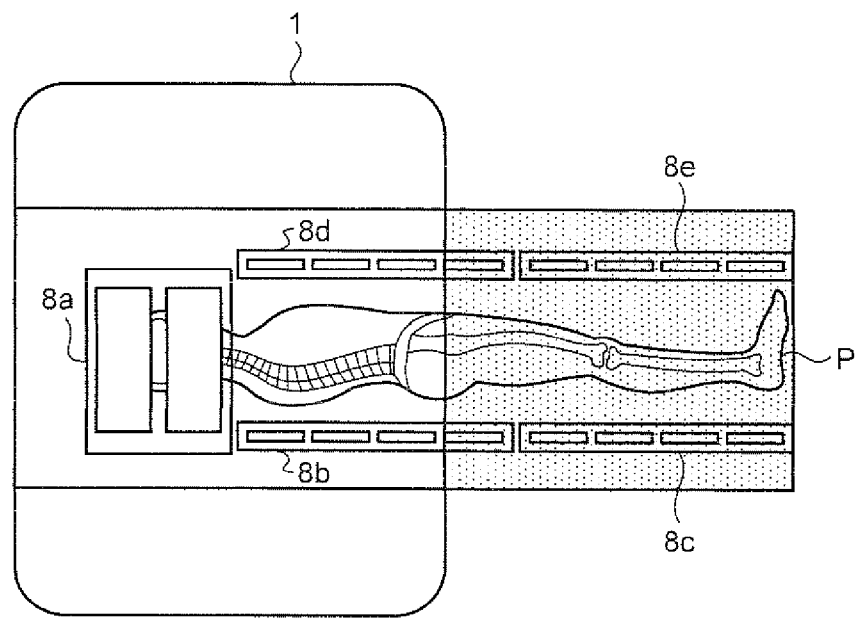
FIG. 10 is a schematic diagram for explaining another embodiment in a case where there is a receiving coil that does not receive Nuclear Magnetic Resonance (NMR) signal.

The embodiment is explained above in a case where the coil-position calculating unit 17a calculates a position of the representative positions with respect to a plurality of receiving coils. However, for example, also sometimes there is a case where when a plurality of receiving coils is arranged and used, there is a receiving coil that does not receive NMR signal. FIG. 10 is a schematic diagram for explaining another embodiment in a case where there is a receiving coil that does not receive NMR signal. According to an example shown in FIG. 10, the receiving coils 8e and 8c are positioned outside the static magnetic-field magnet 1. In such case, the receiving coils 8e and 8c cannot receive NMR signal. Consequently, profile data of the receiving coils 8e and 9c are not created by the data processing unit 13.

Signals received by each of the element coils sometimes include a noise signal that has a small signal value, in some cases. Such noise signal has a small difference in signal values in the arrangement direction of the element coils, resulting in a low degree of confidence of a position of a peak of signal values of NMR signals (or a position of the center of gravity in a distribution of signal values of NMR signals). For example, among five profile data shown in FIG. 4, the NMR signals of the profile data of "ch5" are relatively weak compared with the other profile data. Consequently, the representative position of a receiving coil corresponding to "ch5" cannot be accurately measured.

Figure 11:
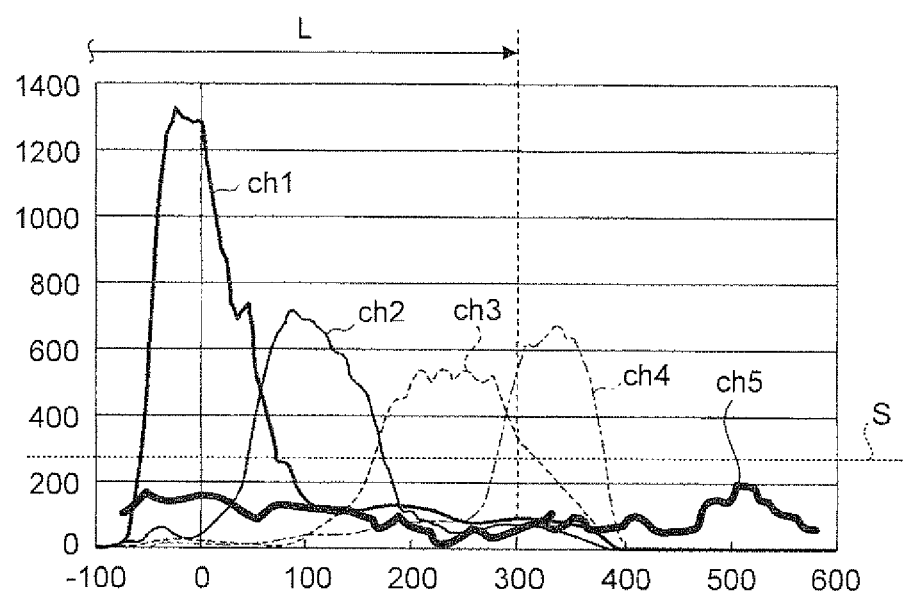
FIG. 11 is a schematic diagram for explaining another embodiment in a case of calculating the position of a representative position by using only NMR signals exceeding a threshold.

Therefore, for example, it can be configured such that the coil-position calculating unit 17a calculates the positions of the representative positions of the receiving coils, by using only NMR signals of which signal value exceeds a threshold among the profile data created by the data processing unit 13. FIG. 11 is a schematic diagram for explaining another embodiment in a case of calculating the position of a representative position by using only NMR signals exceeding a threshold. FIG. 11 depicts the profile data shown in FIG. 4. As shown in FIG. 11, for example, the coil-position calculating unit 17a sets a threshold 5 to 20% of the maximum signal value of the NMR signals of "ch1" of which peak signal value is the highest in this case, the coil-position calculating unit 17a does not subject the profile data of "ch5" of which the maximum signal value is lower than the threshold S, to processing of calculating the position of a representative position.

In this way, as the coil-position calculating unit 17a uses only NMR signals of which signal value exceeds a threshold among the profile data, signals that are considered as noise are excluded from among NMR signals received by respective element coils included in the receiving coils 8a to 8e. Consequently the positions of the representative positions of the receiving coils are calculated by using only signals having a high degree of confidence, so that the positions of the element coils can be measured more accurately.

Generally, a gradient magnetic field keeps the straightness in a certain area around the center of magnetic field; however, if beyond the area, getting farther from the center of magnetic field, the gradient of the magnetic field changes gradually to be smaller. Accordingly, an NMR signal collected in an area in which the straightness of the gradient magnetic field changes has a low degree of confidence of the signal value. Therefore, for example, it can be configured to use only NMR signals collected in an area in which the straightness of the gradient magnetic field is kept, among the profile data.

For example, according to the profile data shown in FIG. 11, it is assumed that the straightness of the gradient magnetic field is kept within a certain acceptable range, in a range L indicated on the horizontal axis. In such case, the coil-position calculating unit 17a calculates the representative positions of the receiving coils by using only NMR signals that the position of a peak signal value of the NMR signals (or the center of gravity of the distribution of signal values of the NMR signals) falls within the range L. In other words, according to the example shown in FIG. 11, the coil-position calculating unit 17a calculates the positions of the representative positions of the receiving coils by using only the NMR signals of "ch1", "ch2", and "ch3".

In this way, the coil-position calculating unit 17a calculates the positions of the representative positions of the receiving coils by using only NMR signals collected within a range in which the straightness of the gradient magnetic field is kept among the profile data, thereby measuring the positions of the element coils more accurately.

Alternatively, the coil-position calculating unit 17a can calculate the representative positions of the receiving coils by using only profile data correlated with a certain fitting function.

When calculating the representative positions by using only NMR signals that satisfy a certain requirement as explained above, for example, the coil-display control unit 17b causes the display unit 15 not to display a receiving coil of which representative position is not calculated.

Figure 12:
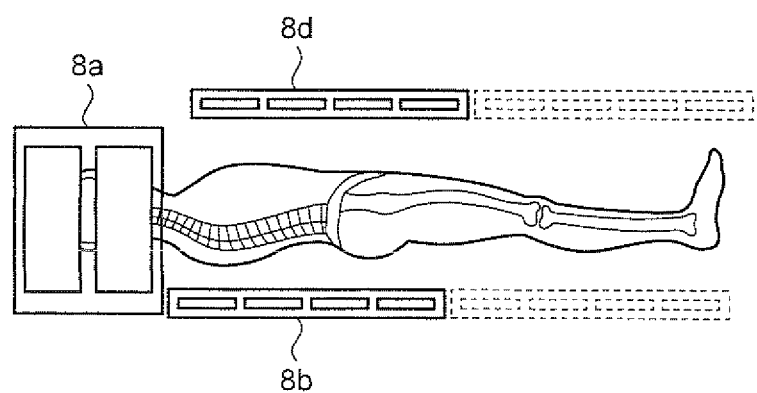
FIG. 12 is a schematic diagram for explaining another embodiment in a case of not-displaying a receiving coil of which representative position is not calculated.

FIG. 12 is a schematic diagram for explaining another embodiment in a case of not-displaying a receiving coil of which representative position is not calculated. For example, when representative position is not calculated with respect to the receiving coils 8e and 8c, the coil-display control unit 17b causes the display unit 15 not to display the receiving coils 8e and 8c, as shown in FIG. 12.

In other words, according to the example explained above, the data processing unit 13 creates profile data with respect to each element coil that indicates a distribution of NMR signals in the arrangement direction of the element coils, based on NMR signals received by each of the element coils included in the receiving coils 8a to 8e. Moreover, the coil-position calculating unit 17a calculates the position of a representative position set on each receiving coil by using only NMR signals that satisfies a certain requirement among the profile data created by the data processing unit 13. The coil-display control unit 17b then causes the display unit 15 to display only the positions of receiving coils of which representative positions are calculated among the receiving coils 8a to 8e, based on the positions of the representative positions calculated by the coil-position calculating unit 17a.

In this way, when a plurality of element coils receives NMR signals, the position of a representative position of a receiving coil is calculated by using only NMR signals that satisfies a certain requirement, accordingly, the positions of the element coils can be measured more accurately. The display unit 15 displays only a receiving coil of which representative position is calculated, thereby indicating to the operator only the receiving coil of which representative position is accurately obtained.

The embodiment is explained above in a case where the coil-position calculating unit 17a calculates respective representative positions of the receiving coils 8a to 8e by using the coil positional information that indicates physical positions of the element coils, and the profile data that indicates a distribution of NMR signals in the arrangement direction of the element coils. However, for example, there can be a case of calculating representative positions such that adjacent receiving coils overlap with each other.

Therefore, it can be configured such that after calculating representative positions with respect each receiving coil, a calculated representative position is corrected so as to keep adjacent receiving coils from overlapping based on outer dimensions of each of the receiving coils. In such case, after calculating the representative position of each receiving coil, the coil-position calculating unit 17a corrects the representative position so as to keep adjacent receiving coils from overlapping based on the outer dimensions of each receiving coil included in the coil positional information stored by the coil-positional information storage unit 14a.

For example, when there are receiving coils between which the amount of overlap is a certain amount or more as a result of calculating positions of the representative positions of the receiving coils, the coil-position calculating unit 17a corrects at least one of calculated positions of the representative positions of the overlapping receiving coils so that the representative positions of the overlapping coils are separated with a shortest interval, based on outer dimensions of the receiving coils included in the coil positional information stored by the coil-positional information storage unit 14a.

For example, depending on a type of receiving coils, there is a receiving coil configured such that part of the receiving coil is arranged so as to overlap with part of another receiving coil when being arranged adjacently to another receiving coil. Therefore, the coil-position calculating unit 17a assumes a case of using such receiving coil, and when the amount of overlap between adjacent receiving coils is a certain amount or more, it is determined that the receiving coils overlap each other. In other words, if adjacent receiving coils do not overlap at all, or if the amount of overlap is within an acceptable range even when the receiving coils overlap, it is determined that the receiving coils do not overlap each other.

Figure 13A:
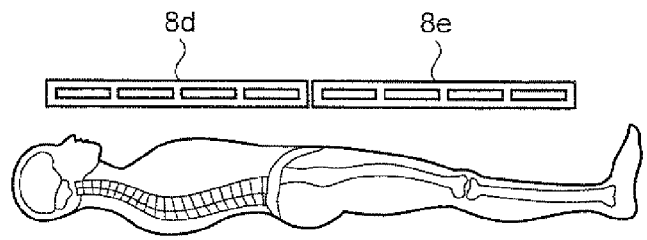
FIGS. 13A to 13D are schematic diagrams for explaining another embodiment in a case of correcting a representative position to keep adjacent receiving coils from overlapping.
Figure 13B:
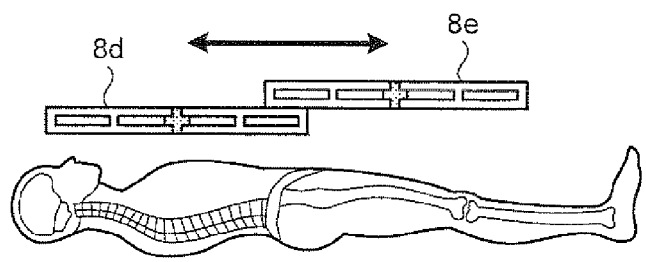

FIGS. 13A to 13D are schematic diagrams for explaining another embodiment in a case of correcting a representative position to keep adjacent receiving coils from overlapping. For example, as shown in FIG. 13A, it is assumed that the receiving coil 8d and the receiving coil 8e each of which is a coil for abdomen are arranged adjacently each other. As a result of calculation of representative positions performed by the coil-position calculating unit 17a, as shown in FIG. 13B, the representative positions are calculated such that the receiving coil 8d and the receiving coil 8e overlap one another in positional relation.

In such case, the coil-position calculating unit 17a refers to the coil positional information stored by the coil-positional information storage unit 14a, and acquires respective outer dimensions of the receiving coil 8d and the receiving coil 8e. The coil-position calculating unit 17a then calculates a shift amount of the representative positions of the receiving coils for arranging the receiving coils to keep them from overlapping based on the acquired outer dimensions. The coil-position calculating unit 17a then corrects the representative position of one of the receiving coils so as to shift to a direction departing from the other receiving coil by the calculated shift amount.

At that time, for example, if the position of any one of the receiving coils is set as fixed according to the coil positional information stored by the coil-positional information storage unit 14a, the coil-position calculating unit 17a does not correct the representative position of the receiving coil, and corrects only the representative position of the other receiving coil so as to shift it to a direction departing from the former receiving coil.

Figure 13C:
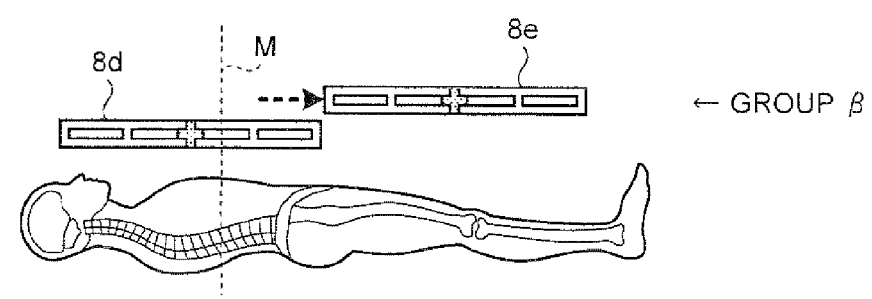

Alternatively, when measurement of the representative positions is divided and performed in a plurality of times; if one of the receiving coils is already measured in advance, the other receiving coil of which representative position is measured later can be corrected. For example, in the example shown in FIG. 13E, when the representative position of the receiving coil 8d is already measured in advance, the coil-position calculating unit 17a corrects the representative position of the receiving coil 8e so as to shift it to a direction departing from the receiving coil 8d, as shown in FIG. 13C. Moreover, when the receiving coils 8d and 8e are measured simultaneously, the coil-position calculating unit 17a gives priority to the position of a receiving coil closer to the center of magnetic field M; and relative to the position, the coil-position calculating unit 17a corrects the representative position of the other receiving coil farther from the center of magnetic field M so as to shift it to a direction departing from the receiving coil closer to the center of magnetic field M.

In other words, when the overlapping receiving coils include a receiving coil of which position is fixed, or a receiving coil of which representative position is already calculated, the coil-position calculating unit 17a refers to the representative position of the receiving coil, and corrects the calculated position of the representative position of another receiving coil based on the position of the referred representative position. Moreover, the coil-position calculating unit 17a corrects the representative position of a receiving coil that is farther from the center of magnetic field among the overlapping receiving coils to a position separated with a shortest interval from the position of the representative position of another receiving coil that is closer to the center of magnetic field.

For example, a coil for head is generally fixed in terms of the position with respect to the couchtop. For this reason, for example, when the representative positions of both a coil for head and a coil for spine are calculated through positional measurement, it is considered that the representative position of the coil for head is more accurate than the representative position of the coil for spine. Accordingly, in such case, the coil-position calculating unit 17a corrects the representative position of the coil for spine to a position separated at a certain distance from the representative position of the coil for head.

Moreover, for example, when using two coils for abdomen, suppose, as a result of performing positional measurement, a representative position of only a first coil for abdomen is calculated, and representative position of a second coil for abdomen is not calculated, due to the threshold processing described above. Moreover, suppose, as a result of further performing positional measurement by moving the couchtop, representative positions of both the first coil and the second coil for abdomen are calculated. In such case, during the positional measurement at the second time, the coil-position calculating unit 17a corrects the representative position of the second coil for abdomen with reference to the representative position of the first coil for abdomen of which representative position is already measured.

Figure 13D:
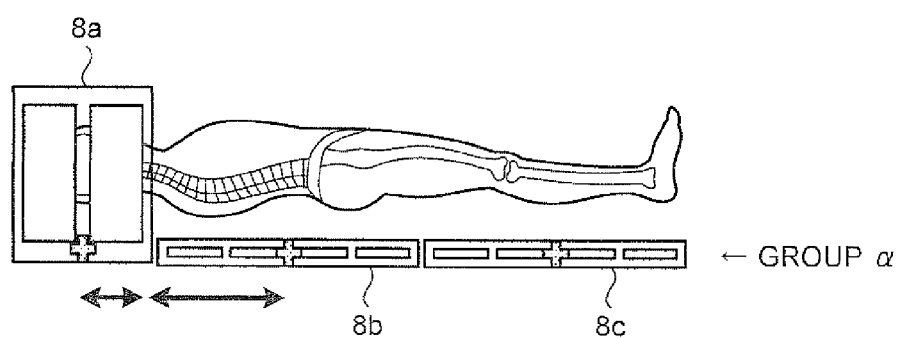

When performing the correction described above, the coil-position calculating unit 17a determines whether the subject receiving coils are adjacent to each other in accordance with the group included in the coil positional information stored by the coil-positional information storage unit 14a. Therefore, the coil positional information has been set such that adjacently arranged receiving coils are assigned the same group. For example, as shown in FIGS. 13C and 13D, it is assumed that the receiving coils 8d and 8e that are adjacent to each other on the abdomen side of the subject are assigned the "group β"; and the receiving coils 8a, 8b, and 8c are assigned the "group α".

In other words, the receiving coils are grouped into a plurality of groups, and the coil-position calculating unit 17a corrects the calculated positions of the representative positions of the overlapping receiving coils group by group. Accordingly, for example, an overlap is accepted between receiving coils belonging to different groups, such as between a coil for abdomen and a coil for spine, so that the representative position of each receiving coil is not corrected. On the other hand, between receiving coils belonging to the same group, such as between coils for abdomen, or between coils for spine, when the amount of overlap is a certain amount or more, the representative position of each receiving coil is corrected.

In this way, the coil-positional information storage unit 14a stores the outer dimensions of the receiving coils as included in the coil positional information; and the coil-position calculating unit 17a calculates respective representative positions of the receiving coils, and then corrects the calculated representative positions so as to keep each of the receiving coils from overlapping based on the coil positional information stored by the coil-positional information storage unit 14a; consequently the positions of the element coils can be appropriately measured even when a plurality of receiving coils is adjacently arranged.

Moreover, the embodiment is explained above in a case where the receiving unit 9 includes a plurality of receiving channels for receiving NMR signals output from a plurality of element coils. However, for example, when there are a number of receiving coils to be used for imaging, the number of element coils is sometimes more than the number of the receiving channels in some cases. In such case, NMR signals cannot be received from all of the element coils in one time data collection.

For this reason, for example, when the number of the element coils is more than the number of the receiving channels, it can be configured such that the data processing unit 13 dividedly creates profile data a plurality of number of times by using the number of the element coils equal to or fewer than the number of the receiving channels, and then the coil-position calculating unit 17a calculates a representative position of a receiving coil each time when profile data is created by the data processing unit 13.

Figure 14:
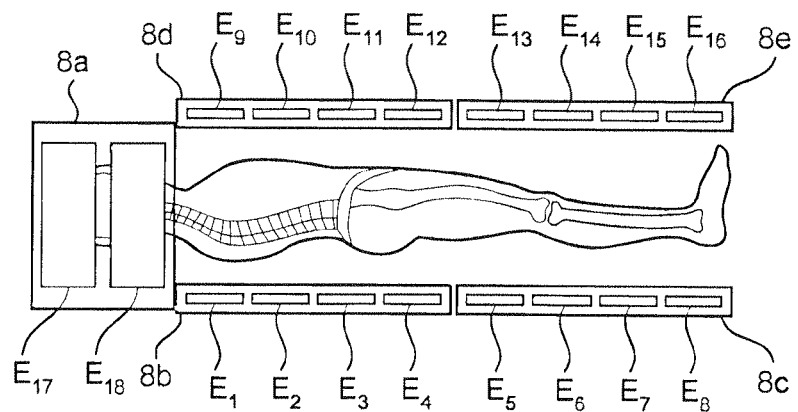
FIG. 14 is a schematic diagram for explaining another embodiment in a case where the number of element coils is more than the number of receiving channels.
Figure 15:
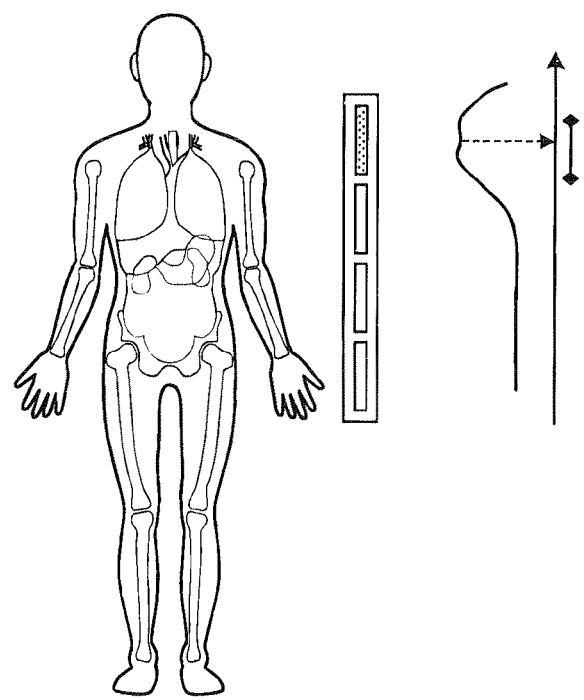
FIG. 15 is a schematic diagram that depicts positional measurement of a receiving coil according to a conventional technology.

FIG. 14 is a schematic diagram for explaining another embodiment in a case where the number of element coils is more than the number of receiving channels. For example, as shown in FIG. 14, it is assumed that the receiving coil 8b includes the element coils $E_1$ to $E_4$; the receiving coil 8c includes element coils $E_5$ to $E_9$; the receiving coil 8d includes element coils $E_9$ to $E_{12}$; the receiving coil 8e includes element coils $E_{13}$ to $E_{16}$; and the receiving coil 8a includes element coils $E_{17}$ to $E_{18}$. In this case, the total number of the element coils is 18. For example, suppose the number of the receiving channels included in the receiving unit 9 is eight.

In such case, the data processing unit 13 creates respective profile data from NMR signals dividedly received three times by using, for example, eight element coils, eight element coils, and two element coils, in order. The coil-position calculating unit 17a then calculates a representative position of each receiving coil after all profile data are created by the data processing unit 13.

In this way, when the number of the element coils is more than the number of the receiving channels, the data processing unit 13 creates profile data dividedly a plurality of number of times by using element coils equal to or fewer than the number of the receiving channels; then after all profile data are created by the data processing unit 13, the coil-position calculating unit 17a calculates a representative position of each receiving coil; accordingly, even when the number of the element coils is more than the number of the receiving channels, the position of each receiving coil can be accurately measured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
a receiving coil having a plurality of element coils, each element coil being configured to receive a magnetic resonance signal emitted from a subject;
a storage unit configured to store coil positional information with respect to each of the element coils that indicates a physical position of each of the element coils relative to a representative position set on the receiving coil;
a creating unit configured to create profile data with respect to each of the element coils based on magnetic resonance signals received by each of the element coils, the profile data indicating a distribution of the magnetic resonance signals in a coil arrangement direction in which the element coils are arranged;
a calculating unit configured to calculate a position of the representative position set on the receiving coil in the coil arrangement direction by performing a regression analysis using (a) the coil positional information and (b) the profile data; and
a control unit configured to cause a display unit to display positions of the element coils based on the representative position calculated by the calculating unit.

2. The magnetic resonance imaging apparatus according to claim 1, wherein the calculating unit is configured to calculate the representative position by performing the regression analysis using a method of least squares.

3. The magnetic resonance imaging apparatus according to claim 1, wherein:

a plurality of receiving coils are arranged adjacently each other is included, the storage unit is configured to further store outer dimensions of the receiving coils as part of the coil positional information, and the calculating unit is configured to calculate the representative position with respect to each of the receiving coils, and then to correct the calculated representative position based on the coil positional information.

4. The magnetic resonance imaging apparatus according to claim 1, wherein:

the calculating unit is configured to calculate the representative position using only magnetic resonance signal values which are equal to or higher than a threshold.

5. The magnetic resonance imaging apparatus according to claim 1, wherein:

the calculating unit is configured to calculate the representative position using only magnetic resonance signals collected within a range in which straightness of a gradient magnetic field is indicated as part of the profile data.

6. The magnetic resonance imaging apparatus according to claim 1, wherein:

the calculating unit is configured to calculate the representative position using only magnetic resonance signals that are correlated with a predetermined fitting function identified as part of the profile data.

7. The magnetic resonance imaging apparatus according to claim 1, further comprising:

a receiving unit configured to receive magnetic resonance signals received by the element coils via a plurality of receiving channels, wherein when the number of element coils is more than the number of receiving channels, the creating unit is configured to create respective profile data, based on magnetic resonance signals that are received a plurality of times using a number of element coils equal to or fewer than the number of receiving channels, and the calculating unit is configured to calculate the representative position after all of the profile data are created by the creating unit.

8. The magnetic resonance imaging apparatus according to claim 3, wherein:

when there are receiving coils overlapping each other by a certain amount or more as a result of calculating of the representative positions of the receiving coils, the calculating unit is configured to correct at least one of the calculated representative positions of overlapping receiving coils so that the representative positions of the overlapping coils are separated with an shortest interval, based on the outer dimensions of the receiving coils included as part of the coil positional information.

9. The magnetic resonance imaging apparatus according to claim 8, wherein:

when the overlapping receiving coils include one of a receiving coil of which position is fixed, and a receiving coil of which representative position is already calculated, the calculating unit is configured to refer to a representative position of the receiving coil, and to correct a calculated representative position of the other receiving coil based on a position of the referred representative position.

10. The magnetic resonance imaging apparatus according to claim 8, wherein:

the calculating unit is configured to correct a representative position of a receiving coil that is farther from a center of magnetic field among the overlapping receiving coils to a position separated from a position of a representative position of another receiving coil that is closer to the center of magnetic field.

11. The magnetic resonance imaging apparatus according to claim 8, wherein:

the receiving coils are grouped into a plurality of groups, and the calculating unit is configured to correct the calculated representative positions of the overlapping coils group-by-group.

12. A magnetic resonance imaging apparatus comprising:

a receiving coil having a plurality of element coils, each element coil being configured to receive a magnetic resonance signal emitted from a subject;

a storage unit configured to store coil positional information with respect to each of the element coils that indicates a physical position of each of the element coils relative to a representative position set on the receiving coil;

a creating unit configured to create profile data with respect to each of the element coils based on magnetic resonance signals received by each of the element coils, the profile data indicating a distribution of the magnetic resonance signals in a coil arrangement direction in which the element coils are arranged;

a calculating unit configured to calculate a representative position set on the receiving coil in the coil arrangement direction by performing a regression analysis using (a) the coil positional information and (b) the profile data; and a setting unit configured to set an element coil to be used for imaging from among the element coils based on the representative position calculated by the calculating unit.

13. The magnetic resonance imaging apparatus according to claim 12, wherein:

the calculating unit is configured to calculate the representative position by performing the regression analysis using a method of least squares.

14. The magnetic resonance imaging apparatus according to claim 12, wherein:

a plurality of receiving coils is arranged adjacently each other, the storage unit is configured to further store outer dimensions of the receiving coils as part of the coil positional information, and the calculating unit is configured to calculate a representative position with respect to each of the receiving coils, and then to correct the calculated position based on the coil positional information.

15. The magnetic resonance imaging apparatus according to claim 12, wherein:

the calculating unit is configured to calculate the representative position using only magnetic resonance signal values that are equal to or higher than a threshold value.

16. The magnetic resonance imaging apparatus according to claim 12, wherein:

the calculating unit is configured to calculate the representative position using only magnetic resonance signals collected within a range in which straightness of a gradient magnetic field is indicated as part of the profile data.

17. The magnetic resonance imaging apparatus according to claim 12, wherein:

the calculating unit is configured to calculate the representative position using only magnetic resonance signals that are correlated with a predetermined fitting function identified as part of the profile data.

18. The magnetic resonance imaging apparatus according to claim 12, further comprising:
a receiving unit configured to receive magnetic resonance signals received by the element coils via a plurality of receiving channels,
wherein
when the number of element coils is more than the number of receiving channels, the creating unit is configured to create respective profile data, based on magnetic resonance signals that are received a plurality of times using a number of element coils equal to or fewer than the number of receiving channels, and
the calculating unit is configured to calculate the representative position after all of the profile data are created by the creating unit.

19. A magnetic resonance imaging apparatus comprising:
a plurality of receiving coils which each include a plurality of element coils configured to receive a magnetic resonance signal emitted from a subject;
a creating unit configured to create profile data with respect to each of the element coils based on magnetic resonance signals received by each of the element coils, the profile data indicating a distribution of the magnetic resonance signals in a coil arrangement direction in which the element coils are arranged;
a calculating unit configured to calculate representative positions set on the receiving coils in the coil arrangement direction based on the profile data; and
a control unit configured to cause a display unit to display only a position of a receiving coil of which a position of a representative position is calculated among the receiving coils, based on the representative positions calculated by the calculating unit.

20. The magnetic resonance imaging apparatus according to claim 19, wherein:
a plurality of receiving coils are arranged adjacently each other,
the storage unit is configured to further store outer dimensions of the receiving coils as part of stored the coil positional information, and
the calculating unit is configured to calculate representative position with respect to each of the receiving coils, and then to correct the calculated position based on the coil positional information.

* * * * *